(12) United States Patent
Li

(10) Patent No.: US 11,094,896 B2
(45) Date of Patent: Aug. 17, 2021

(54) FLEXIBLE OLED DISPLAY PANEL AND METHOD FOR FABRICATING SAME

(71) Applicant: Wuhan China Star Optoelectronics Semiconductor Display Technology Co., Ltd., Hubei (CN)

(72) Inventor: Zhao Li, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 4 days.

(21) Appl. No.: 16/622,770

(22) PCT Filed: Nov. 25, 2019

(86) PCT No.: PCT/CN2019/120752
§ 371 (c)(1),
(2) Date: Dec. 13, 2019

(87) PCT Pub. No.: WO2021/012547
PCT Pub. Date: Jan. 28, 2021

(65) Prior Publication Data
US 2021/0119156 A1 Apr. 22, 2021

(30) Foreign Application Priority Data
Jul. 24, 2019 (CN) .......................... 201910669326.6

(51) Int. Cl.
*H01L 51/00* (2006.01)
*H01L 27/32* (2006.01)
(Continued)

(52) U.S. Cl.
CPC .......... *H01L 51/0097* (2013.01); *C03C 15/00* (2013.01); *C03C 17/32* (2013.01);
(Continued)

(58) Field of Classification Search
None
See application file for complete search history.

(56) References Cited

U.S. PATENT DOCUMENTS

2010/0163859 A1* 7/2010 Yamazaki ............. H01L 51/529
257/40
2018/0090698 A1* 3/2018 Jeong .................. H01L 27/3276
(Continued)

FOREIGN PATENT DOCUMENTS

CN 104392901 A 3/2015
CN 105702624 A 6/2016
(Continued)

OTHER PUBLICATIONS

Jin-gang Liu, et. al.. (Oct. 7, 2015). Colorless and Transparent high-Temperature-Resistant Polymer Optical Films—Current Status and Potential Applications in Optoelectronic Fabrications, Optoelectronics—Materials and Devices, Sergei L. Pyshkin and John Ballato, IntechOpen. (Year: 2015).*

*Primary Examiner* — J. E. Schoenholtz
(74) *Attorney, Agent, or Firm* — Hamre, Schumann, Mueller & Larson, P.C.

(57) ABSTRACT

The present disclosure provides a flexible organic light emitting diode (OLED) display panel and a method for fabricating the same. The flexible OLED display panel includes a first flexible transparent substrate, a buffer layer covering the first flexible transparent substrate, and a second flexible transparent substrate covering the buffer layer. A surface of the first flexible transparent substrate in contact with the buffer layer is formed with a first rough structure. A surface of the buffer layer in contact with the second flexible transparent substrate is formed with a second rough structure.

20 Claims, 2 Drawing Sheets

(51) Int. Cl.
  *H01L 51/52*  (2006.01)
  *H01L 51/56*  (2006.01)
  *C03C 15/00*  (2006.01)
  *C03C 17/32*  (2006.01)

(52) U.S. Cl.
  CPC ........ *H01L 27/3244* (2013.01); *H01L 51/003* (2013.01); *H01L 51/524* (2013.01); *H01L 51/56* (2013.01); *C03C 2218/152* (2013.01); *H01L 2227/326* (2013.01); *H01L 2251/5338* (2013.01)

(56) References Cited

U.S. PATENT DOCUMENTS

| | | |
|---|---|---|
| 2018/0104915 A1 | 4/2018 | Liu |
| 2019/0013497 A1* | 1/2019 | So .................. H01L 51/5092 |
| 2019/0288016 A1 | 9/2019 | Gao et al. |

FOREIGN PATENT DOCUMENTS

| | | |
|---|---|---|
| CN | 107394041 A | 11/2017 |
| CN | 107611162 A | 1/2018 |
| CN | 107968152 A | 4/2018 |

* cited by examiner

FLEXIBLE OLED DISPLAY PANEL AND METHOD FOR FABRICATING SAME

FIELD OF INVENTION

The present disclosure relates to a field of display panel technology, and particularly to a flexible organic light emitting diode (OLED) display panel and a method for fabricating the same.

BACKGROUND

A flexible OLED display panel, from bottom to top, comprises a flexible transparent substrate, a thin film transistor (TFT) layer, an organic light emitting layer, and an encapsulation layer. In flexible OLED display panel technology, a polyimide (PI) flexible transparent substrate is generally used in place of a conventional glass substrate to achieve a foldable and flexible display panel. In order to achieve a better water oxygen barrier property, a double-layer flexible transparent substrate, i.e. a structure of flexible transparent substrate-buffer layer-flexible transparent substrate, is generally used in place of a single-layer flexible transparent substrate.

Recently, industry generally adopts a method of "coating-baking" to prepare a double-layer flexible transparent substrate. Because a double-layer flexible transparent substrate is thick, a thermal stress generated in a subsequent high temperature process tends to cause a glass substrate to warp. This affects subsequent processes for an OLED display panel and increases a risk of peeling between a flexible layer and a buffer layer, thereby reducing a yield of the OLED display panel.

SUMMARY OF DISCLOSURE

The present disclosure provides a flexible OLED display panel and a method for fabricating the same to solve the problem that a yield of an OLED display panel is reduced due to warpage of a glass substrate and peeling between a flexible layer and a buffer layer during a fabricating process of the OLED display panel.

In order to solve the aforementioned problem, the present disclosure provides the following technical solutions.

The present disclosure provides a flexible OLED display panel, comprising a first flexible transparent substrate, a buffer layer covering the first flexible transparent substrate, and a second flexible transparent substrate covering the buffer layer. A surface of the first flexible transparent substrate in contact with the buffer layer is formed with a first rough structure. A surface of the buffer layer in contact with the second flexible transparent substrate is formed with a second rough structure.

In an embodiment, the first rough structure is composed of a plurality of first grooves or first protrusions arranged in an array. The second rough structure is composed of a plurality of second grooves or second protrusions arranged in an array.

In an embodiment, a groove depth of each first groove or a height of each first protrusion is 0 μm to 0.5 μm.

In an embodiment, a groove depth of each second groove or a height of each second protrusion is 0 μm to 0.5 μm.

In an embodiment, a distance between two adjacent first grooves or two adjacent first protrusions is 10 μm to 20 μm.

In an embodiment, a distance between two adjacent second grooves or two adjacent second protrusions is 10 μm to 20 μm.

In an embodiment, a cross section of each first groove or each first protrusion in a direction parallel to the first flexible transparent substrate is shaped as a square having a side length of 0 μm to 10 μm.

In an embodiment, a cross section of each second groove or each second protrusion in a direction parallel to the buffer layer is shaped as a square having a side length of 0 μm to 10 μm.

In an embodiment, the buffer layer is composed of silicon oxide, and the buffer layer has a thickness of 0.5 μm to 2 μm.

In an embodiment, the first flexible transparent substrate is composed of polyimide, and the first flexible transparent substrate has a thickness of 8 μm to 10 μm.

In an embodiment, the second flexible transparent substrate is composed of polyimide, and the second flexible transparent substrate has a thickness of 5 μm to 10 μm.

In an embodiment, the flexible OLED display panel further comprises a TFT layer disposed on a side of the second flexible transparent substrate away from the buffer layer, an organic light emitting layer disposed on a side of the TFT layer away from the second flexible transparent substrate, and an encapsulation layer disposed on the organic light emitting layer for encapsulating the organic light emitting layer.

The present disclosure further provides a method for fabricating a flexible OLED display panel, comprising:

forming a first flexible transparent substrate having a first rough structure on a surface thereof;

forming a buffer layer on the first rough structure, wherein the buffer layer has a second rough structure on a surface thereof away from the first flexible transparent substrate; and forming a second flexible transparent substrate on the second rough structure.

In an embodiment, the forming the first flexible transparent substrate comprises: providing a glass substrate and forming the first flexible transparent substrate on the glass substrate. After the forming the second flexible transparent substrate on the second rough structure, the method further comprises: peeling the glass substrate from the first flexible transparent substrate.

In an embodiment, the peeling the glass substrate from the first flexible transparent substrate is performed by laser.

In an embodiment, the forming the first flexible transparent substrate on the glass substrate comprises: coating a polyimide solution on the glass substrate and heating the polyimide solution to form the first flexible transparent substrate.

In an embodiment, the first rough structure is formed on the surface of the first flexible transparent substrate by dry etching.

In an embodiment, the forming the buffer layer on the first rough structure is performed by chemical vapor deposition.

In an embodiment, the second rough structure is formed on the surface of the buffer layer away from the first flexible transparent substrate by dry etching.

In an embodiment, the forming the second flexible transparent substrate on the second rough structure comprises: coating a polyimide solution on the second rough structure and heating the polyimide solution to form the second flexible transparent substrate.

By forming a first rough structure between a first flexible transparent substrate and a buffer layer and forming a second rough structure between a second flexible transparent substrate and the buffer layer, the present invention enhances adhesive forces of the buffer layer to the first flexible transparent substrate and the second flexible transparent substrate, and thus prevents the first flexible transparent substrate and the second flexible transparent substrate from being peeled from the buffer layer in a subsequent bonding process, thereby improving a bonding property of a flexible OLED display panel. The invention also reduces thermal stress in the first flexible transparent substrate and the second flexible transparent substrate, and thus avoids warpage of a glass substrate caused by a subsequent high temperature process, thereby improving a stability of the flexible OLED display panel.

BRIEF DESCRIPTION OF DRAWINGS

In order to more clearly illustrate the technical solutions in the embodiments of the present disclosure or the prior art, a brief description of accompanying drawings used in the description of the embodiments of the present disclosure or the prior art will be given below. The accompanying drawings in the following description are merely some embodiments of the present disclosure. For those skilled in the art, other drawings may be obtained from these accompanying drawings without creative labor.

DETAILED DESCRIPTION

Figure 1:
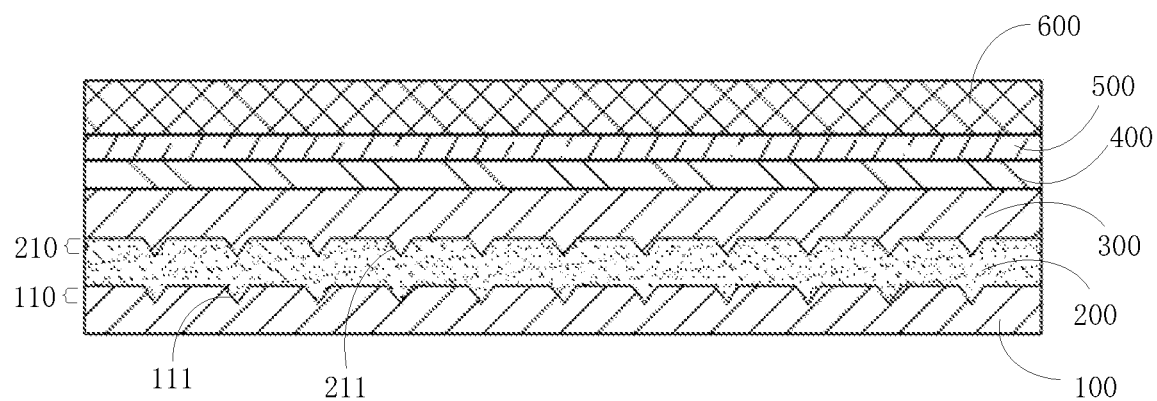
FIG. 1 is a schematic structural diagram of a flexible OLED display panel according to an embodiment of the present disclosure.

The specific structural and functional details disclosed herein are merely representative and are for the purpose of describing exemplary embodiments of the present disclosure. The present disclosure may be embodied in many alternative ways and should not be construed as being limited only to the embodiments described herein.

In the description of the present disclosure, it should be understood that location or position relationships indicated by terms, such as "center", "transverse", "up", "down", "left", "right", "vertical", "horizontal", "top", "bottom", "within", and "outside" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure. Furthermore, terms such as "first" and "second" are used merely for the purpose of description, but shall not be construed as indicating or implying relative importance or implicitly indicating a number of the indicated technical feature. Hence, the feature defined with "first" and "second" may explicitly or implicitly includes one or more of this feature. In the description of the present disclosure, a term "multiple" means, unless otherwise stated, "two or more". Moreover, terms "comprise" and any other variation thereof are intended to cover a non-exclusive inclusion.

In the present disclosure, it should be noted that, unless otherwise explicitly specified or defined, the terms such as "mount", "connect", and "connection" should be interpreted in a broad sense. For example, a connection may be a fixed connection, a detachable connection, or an integral connection. A connection may be a mechanical connection or an electrical connection. A connection may be a direct connection, or may be an indirect connection via an intermediate medium, or may be communication between interiors of two elements. It may be appreciated by those of ordinary skill in the art that the specific meanings of the aforementioned terms in the present disclosure can be understood depending on specific situations.

The terms used herein are for the purpose of describing particular embodiments only and is not intended to be limiting of example embodiments. As used herein, the singular forms "a" and "an" are intended to include the plural forms as well, unless the context clearly indicates otherwise. It will be further understood that the terms "comprise" and/or "include" used herein specify the presence of stated features, integers, steps, operations, elements and/or components, but do not preclude the presence or addition of one or more other features, integers, steps, operations, elements, components and/or groups thereof.

The present disclosure will be further described in detail below in combination with accompany drawings and embodiments.

Figure 2:
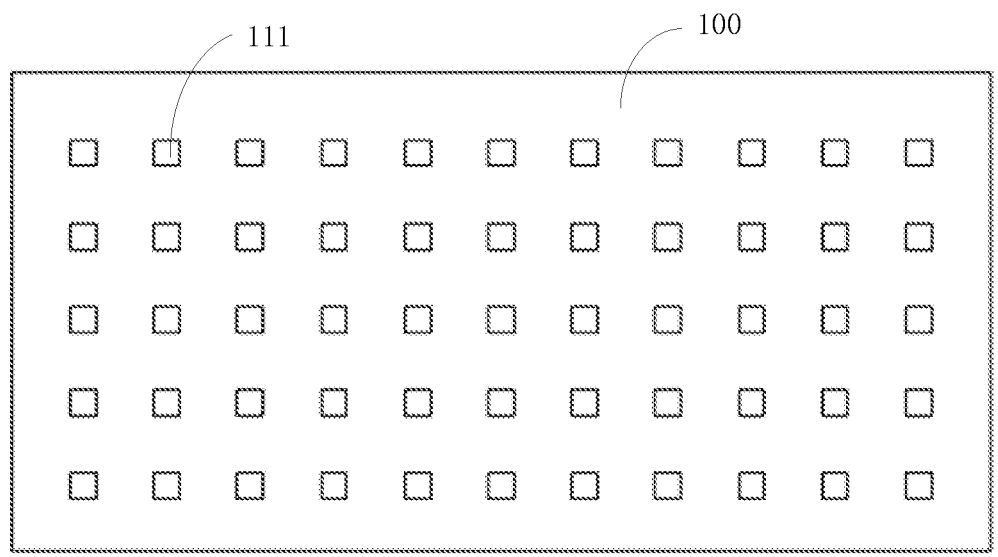
FIG. 2 is a top view of a first flexible transparent substrate in a flexible OLED display panel according to an embodiment of the present disclosure.
Figure 3:
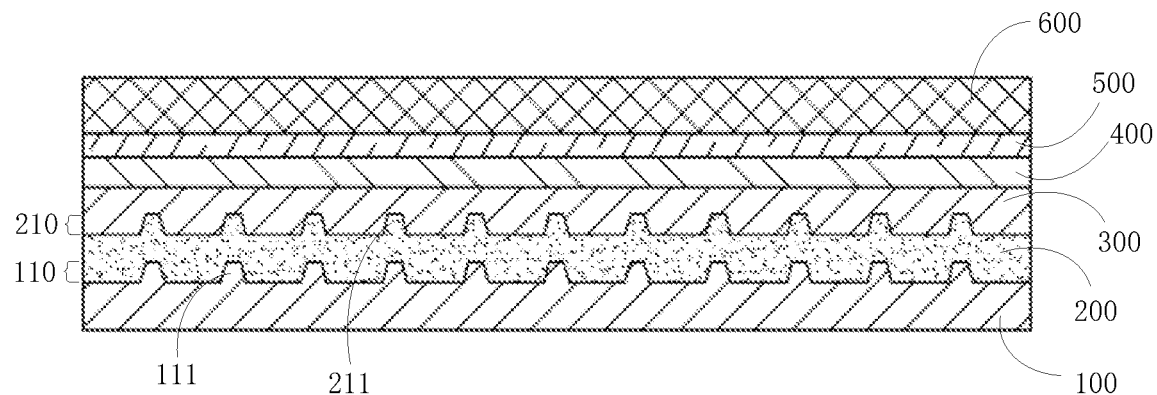
FIG. 3 is a schematic structural diagram of a flexible OLED display panel according to another embodiment of the present disclosure.

As shown in FIG. 1-3, the present disclosure provides a flexible OLED display panel comprising a first flexible transparent substrate 100, a buffer layer 200 covering the first flexible transparent substrate 100, and a second flexible transparent substrate 300 covering the buffer layer 200. A surface of the first flexible transparent substrate 100 in contact with the buffer layer 200 is formed with a first rough structure 110. A surface of the buffer layer 200 in contact with the second flexible transparent substrate 300 is formed with a second rough structure 210.

In an embodiment, the buffer layer 200 covers the first flexible transparent substrate 100. It can be understood that, with respect to the first rough structure 110 formed on the surface of the first flexible transparent substrate 100 contacting the buffer layer 200, apparently, a surface of the buffer layer 200 in contact with the first flexible transparent substrate 100 is formed with a structure that conforms to a shape of the first rough structure 110. This facilitates that the buffer layer 200 is in full-surface contact with and integrally covers the first flexible transparent substrate 100. Similarly, with respect to the second rough structure 210 formed on the surface of the buffer layer 200 contacting the second flexible transparent substrate 300, a surface of the second flexible transparent substrate 300 in contact with the buffer layer 200 is formed with a structure that conforms to a shape of the second rough structure 210.

In an embodiment, the first rough structure 110 is composed of a plurality of first grooves 111 or first protrusions 112 arranged in an array; and the second rough structure 210 is composed of a plurality of second grooves 211 or second protrusions 212 arranged in an array. Obviously, the first rough structure 110 is the first grooves 111 or the first protrusions 112, and the second rough structure 210 is the second grooves 211 or the second protrusions 212, which can only be regarded as specific structural forms of the first rough structure 110 and the second rough structure 210. The first rough structure 110 and the second rough structure 210 may also be other rough structural forms that reduce thermal stress and are not limited herein.

It can be understood that the first rough structure 110 and the second rough structure 210 have various structural forms, and combinations thereof can make a structural form of a flexible OLED display panel more diverse. In an embodiment, as shown in FIG. 1, the first rough structure 110 is the first grooves 111, and the second rough structure 210 is the second grooves 211. As shown in FIG. 3, the first rough structure 110 is the first protrusions 112 and the second rough structure 210 is the second protrusions 212. For other combinations, for example, the first rough structure 110 is the first protrusions 112 and the second rough structure 210 is the second grooves 211, will not be described herein.

In an embodiment, a groove depth of each first groove 111 or a height of each first protrusion 112 is 0 μm to 0.5 μm. A groove depth of each second groove 211 or a height of each second protrusion 212 is 0 μm to 0.5 μm. A distance between two adjacent first grooves 111 or two adjacent first protrusions 112 is 10 μm to 20 μm. A distance between two adjacent second grooves 211 or two adjacent second protrusions 212 is 10 μm to 20 μm. Specifically, cross sections of each first groove 111 and each second groove 211 in a direction perpendicular to the first flexible transparent substrate 100 may be shaped as "V" or a trapezoid. Specifically, as shown in FIG. 1, vertical cross sections of each first groove 111 and each second groove 211 are both shaped as "V". In addition, as shown in FIG. 3, the cross sections of each first protrusion 112 and each second protrusion 212 in the direction perpendicular to the first flexible transparent substrate 100 is specifically shaped as a trapezoidal structure.

It can be understood that cross sections of each first groove 111, each first protrusion 112, each second groove 211, and each second protrusion 212 in a direction parallel to the first flexible transparent substrate 100 may be shaped as a square, a circle or the like. Specifically, as shown in FIG. 2, a horizontal section of each first groove 111 is shaped as a square. The cross section of each first groove 111 or each first protrusion 112 in a direction parallel to the first flexible transparent substrate 110 is shaped as a square having a side length of 0 μm to 10 μm. The cross section of each second groove 211 or each second protrusion 212 in a direction parallel to the buffer layer 200 is shaped as a square having a side length of 0 μm to 10 μm. In addition, FIG. 2 shows a matrix arrangement of the first grooves 111. Obviously, when the first rough structure 110 or the second rough structure 210 is in other structural forms, arrangements of the first protrusions 112, the second grooves 211, and the second protrusions 212 may refer to the arrangement of the first grooves 111 shown in FIG. 1 and will not be shown one by one in other drawings.

In an embodiment, the buffer layer 200 is composed of silicon oxide, and the buffer layer 200 has a thickness of 0.5 μm to 2 μm. The first flexible transparent substrate 100 and the second flexible transparent substrate 300 are composed of polyimide. The first flexible transparent substrate 100 has a thickness of 8 μm to 10 μm. The second flexible transparent substrate 300 has a thickness of 5 μm to 10 μm.

In an embodiment, the flexible OLED display panel further comprises a TFT layer 400 disposed on a side of the second flexible transparent substrate 300 away from the buffer layer 200, an organic light emitting layer 500 disposed on a side of the TFT layer 400 away from the second flexible transparent substrate 300, and an encapsulation layer 600 disposed on the organic light emitting layer 500 for encapsulating the organic light emitting layer 500.

By forming a first rough structure between a first flexible transparent substrate and a buffer layer and forming a second rough structure between a second flexible transparent substrate and the buffer layer, a flexible OLED display panel of the present invention enhances adhesive forces of the buffer layer to the first flexible transparent substrate and the second flexible transparent substrate, and thus prevents the first flexible transparent substrate and the second flexible transparent substrate from being peeled from the buffer layer in a subsequent bonding process, thereby improving a bonding property of a flexible OLED display panel. The flexible OLED display panel of the present invention also reduces thermal stress in the first flexible transparent substrate and the second flexible transparent substrate, and thus avoids warpage of a glass substrate caused by a subsequent high temperature process, thereby improving a stability of the flexible OLED display panel.

Figure 4:
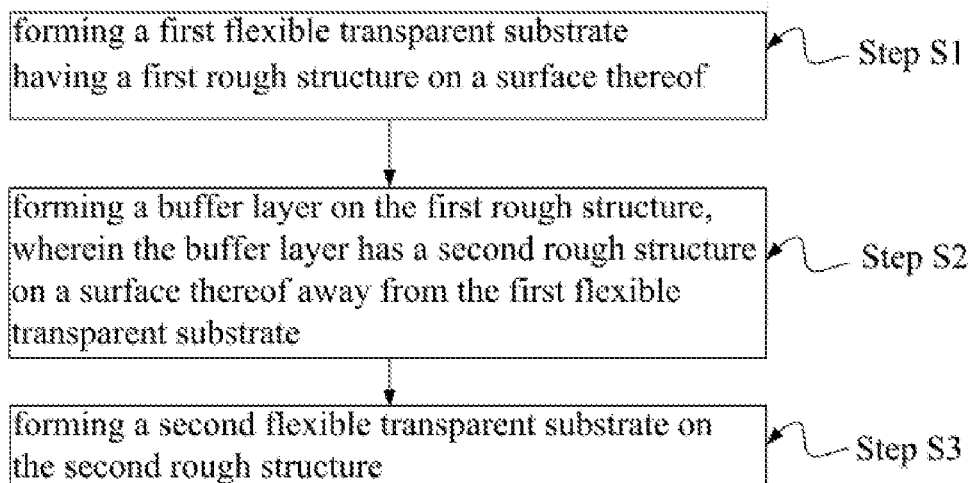
FIG. 4 is a flowchart of a method for fabricating a flexible OLED display panel according to an embodiment of the present disclosure.

As shown in FIG. 4, the present disclosure further provides a method for fabricating a flexible OLED display panel comprising:

Step S1: forming a first flexible transparent substrate 100 having a first rough structure 110 on a surface thereof;

Step S2: forming a buffer layer 200 on the first rough structure 110, wherein the buffer layer 200 has a second rough structure 210 on a surface thereof away from the first flexible transparent substrate 100;

Step S3: forming a second flexible transparent substrate 300 on the second rough structure 210.

In an embodiment, in Step S1, the forming the first flexible transparent substrate 100 comprises: providing a glass substrate and forming the first flexible transparent substrate 100 on the glass substrate. After Step S3, the forming the second flexible transparent substrate 300 on the second rough structure 210, the method further comprises: peeling the glass substrate from the first flexible transparent substrate 100. It can be understood that the step of peeling the glass substrate from the first flexible transparent substrate 100 is specifically performed after corresponding functional layers (such as the TFT layer 400, the organic light emitting layer 500, and the encapsulation layer 600, etc.) are formed on the second flexible transparent substrate 300.

In an embodiment, taking the structure shown in FIG. 1 as an example, the method specifically comprises:

coating a polyimide solution to a clean glass substrate, and solidifying the polyimide solution by heating to form a first flexible transparent substrate 100 having a thickness of 8 μm to 10 μm;

forming first grooves 111 arranged in an array on the first flexible transparent substrate 100 by dry etching under a mask having square holes arranged in an array;

wherein, on the mask, each square hole has a side length of 5 μm to 10 μm, and a distance between two adjacent square holes is 10 μm to 20 μm;

forming a buffer layer 200 on the first flexible substrate 100, and forming second grooves 211 arranged in an array on the buffer layer 200 by dry etching. It can be understood that the above two dry etchings can be performed using a same mask without additional replacement of other masks. Similarly, the structure shown in FIG. 3 (the first rough structure 110 is the first protrusions 112, and the second rough structure 210 is the second protrusions 212) can also be fabricated through a same mask, and will not be described herein.

By forming a first rough structure between a first flexible transparent substrate and a buffer layer and forming a second rough structure between a second flexible transparent substrate and the buffer layer, a method for fabricating a flexible OLED display panel of the present invention reduces thermal stress in the first flexible transparent substrate and the second flexible transparent substrate, and thus avoids warpage of a glass substrate caused by a subsequent high temperature process, thereby improving a stability of the flexible OLED display panel.

In the above, by forming a first rough structure between a first flexible transparent substrate and a buffer layer and forming a second rough structure between a second flexible transparent substrate and the buffer layer, the present invention enhances adhesive forces of the buffer layer to the first flexible transparent substrate and the second flexible transparent substrate, and thus prevents the first flexible transparent substrate and the second flexible transparent substrate from being peeled from the buffer layer in a subsequent bonding process, thereby improving a bonding property of a flexible OLED display panel. The invention also reduces thermal stress in the first flexible transparent substrate and the second flexible transparent substrate, and thus avoids warpage of a glass substrate caused by a subsequent high temperature process, thereby improving a stability of the flexible OLED display panel.

The present invention has been described in the above preferred embodiments, but the preferred embodiments are not intended to limit the scope of the present invention, and those skilled in the art may make various modifications without departing from the scope of the present invention. The scope of the present invention is determined by claims.

What is claimed is:

1. A flexible organic light emitting diode (OLED) display panel, comprising:
    a first flexible transparent substrate;
    a buffer layer covering the first flexible transparent substrate; and
    a second flexible transparent substrate covering the buffer layer;
    wherein a surface of the first flexible transparent substrate in contact with the buffer layer is formed with a first rough structure, the first rough structure is composed of a plurality of first grooves or first protrusions arranged in an array, a cross section of each first groove or each first protrusion in a direction parallel to the first flexible transparent substrate is shaped as a square; and
    wherein a surface of the buffer layer in contact with the second flexible transparent substrate is formed with a second rough structure.

2. The flexible OLED display panel according to claim 1, wherein
    the second rough structure is composed of a plurality of second grooves or second protrusions arranged in an array.

3. The flexible OLED display panel according to claim 1, wherein a groove depth of each first groove or a height of each first protrusion is greater than 0 μm and less than or equal to 0.5 μm.

4. The flexible OLED display panel according to claim 2, wherein a groove depth of each second groove or a height of each second protrusion is greater than 0 μm and less than or equal 0.5 μm.

5. The flexible OLED display panel according to claim 1, wherein a distance between two adjacent first grooves or two adjacent first protrusions is 10 μm to 20 μm.

6. The flexible OLED display panel according to claim 2, wherein a distance between two adjacent second grooves or two adjacent second protrusions is 10 μm to 20 μm.

7. The flexible OLED display panel according to claim 1, wherein the square has a side length greater than 0 μm and less than or equal to 10 μm.

8. The flexible OLED display panel according to claim 2, wherein a cross section of each second groove or each second protrusion in a direction parallel to the buffer layer is shaped as a square.

9. The flexible OLED display panel according to claim 2, wherein a cross section of each second groove or each second protrusion in a direction parallel to the buffer layer is shaped as a square having a side length of greater than 0 μm and less than or equal to 10 μm.

10. The flexible OLED display panel according to claim 1, wherein the first flexible transparent substrate is composed of polyimide, and the first flexible transparent substrate has a thickness of 8 μm to 10 μm.

11. The flexible OLED display panel according to claim 1, wherein the second flexible transparent substrate is composed of polyimide, and the second flexible transparent substrate has a thickness of 5 μm to 10 μm.

12. The flexible OLED display panel according to claim 1, further comprises:
    a TFT layer disposed on a side of the second flexible transparent substrate away from the buffer layer;
    an organic light emitting layer disposed on a side of the TFT layer away from the second flexible transparent substrate; and
    an encapsulation layer disposed on the organic light emitting layer for encapsulating the organic light emitting layer.

13. A method for fabricating a flexible organic light emitting diode (OLED) display panel, comprising:
    forming a first flexible transparent substrate having a first rough structure on a surface thereof, wherein the first rough structure is composed of a plurality of first grooves or first protrusions arranged in an array, and a cross section of each first groove or each first protrusion in a direction parallel to the first flexible transparent substrate is shaped as a square;
    forming a buffer layer on the first rough structure, wherein the buffer layer has a second rough structure on a surface thereof away from the first flexible transparent substrate; and
    forming a second flexible transparent substrate on the second rough structure.

14. The method for fabricating the flexible OLED display panel according to claim 13, wherein
    the forming the first flexible transparent substrate comprises:
        providing a glass substrate; and
        forming the first flexible transparent substrate on the glass substrate; and
    after the forming the second flexible transparent substrate on the second rough structure, the method further comprises:
        peeling the glass substrate from the first flexible transparent substrate.

15. The method for fabricating the flexible OLED display panel according to claim 14, wherein the peeling the glass substrate from the first flexible transparent substrate is performed by laser.

16. The method for fabricating the flexible OLED display panel according to claim 13, wherein the second rough structure is composed of a plurality of second grooves or second protrusions arranged in an array, and a cross section of each second groove or each second protrusion in a direction parallel to the buffer layer is shaped as a square.

17. The method for fabricating the flexible OLED display panel according to claim 13, wherein the first rough structure is formed on the surface of the first flexible transparent substrate by dry etching.

18. The method for fabricating the flexible OLED display panel according to claim 13, wherein the forming the buffer layer on the first rough structure is performed by chemical vapor deposition.

19. The method for fabricating the flexible OLED display panel according to claim 13, wherein the second rough structure is formed on the surface of the buffer layer away from the first flexible transparent substrate by dry etching.

20. The method for fabricating the flexible OLED display panel according to claim 13, wherein the forming the second flexible transparent substrate on the second rough structure comprises:

coating a polyimide solution on the second rough structure; and heating the polyimide solution to form the second flexible transparent substrate.

\* \* \* \* \*